United States Patent
Fukasawa et al.

(10) Patent No.: US 8,596,820 B2
(45) Date of Patent: Dec. 3, 2013

(54) LED UNIT AND LED LIGHTING LAMP USING THE LED UNIT

(75) Inventors: Koichi Fukasawa, Fujiyoshida (JP); Sadato Imai, Fujiyoshida (JP); Masayoshi Kanamori, Fujiyoshida (JP)

(73) Assignee: Citizen Electronics Co., Ltd., Yamanashi (JP)

(*) Notice: Subject to any disclaimer, the term of this patent is extended or adjusted under 35 U.S.C. 154(b) by 663 days.

(21) Appl. No.: 11/911,658

(22) PCT Filed: Apr. 13, 2006

(86) PCT No.: PCT/JP2006/307836
§ 371 (c)(1),
(2), (4) Date: Feb. 23, 2009

(87) PCT Pub. No.: WO2006/112356
PCT Pub. Date: Oct. 26, 2006

(65) Prior Publication Data
US 2010/0046220 A1    Feb. 25, 2010

(30) Foreign Application Priority Data
Apr. 14, 2005    (JP) .................... 2005-117616

(51) Int. Cl.
*F21S 4/00*    (2006.01)
*F21V 21/00*    (2006.01)
*H01R 33/00*    (2006.01)

(52) U.S. Cl.
USPC ..................... 362/249.02; 362/646

(58) Field of Classification Search
USPC ........................... 362/249.02, 646
See application file for complete search history.

(56) References Cited

U.S. PATENT DOCUMENTS

| | | | | |
|---|---|---|---|---|
| 4,173,035 A | * | 10/1979 | Hoyt | 362/249.04 |
| 5,107,408 A | * | 4/1992 | Vernondier | 362/238 |
| 5,375,044 A | * | 12/1994 | Guritz | 362/104 |
| 6,428,189 B1 | * | 8/2002 | Hochstein | 362/373 |
| 6,834,981 B2 | * | 12/2004 | Nagai et al. | 362/240 |
| 6,874,910 B2 | * | 4/2005 | Sugimoto et al. | 362/294 |
| 6,880,952 B2 | * | 4/2005 | Kiraly et al. | 362/218 |
| 6,995,405 B2 | * | 2/2006 | Braddell et al. | 257/99 |
| 6,999,318 B2 | * | 2/2006 | Newby | 361/719 |
| 7,014,337 B2 | * | 3/2006 | Chen | 362/240 |

(Continued)

FOREIGN PATENT DOCUMENTS

| | | |
|---|---|---|
| JP | 11-266036 A | 9/1999 |
| JP | 11-345999 A | 12/1999 |

(Continued)

OTHER PUBLICATIONS

Japanese Office Action issued May 22, 2008 (translation of pertinent parts).

(Continued)

*Primary Examiner* — David J Makiya
(74) *Attorney, Agent, or Firm* — Browdy and Neimark, PLLC (57) ABSTRACT

The present invention is an LED unit having a thermal-release structure including a base having high thermal conductivity, a circuit board which includes a wiring pattern and is provided on the base, at least one LED element which is electrically connected to the wiring pattern and disposed on the base, and a light-transmitting resinous body provided to cover above the base to seal the LED element.

9 Claims, 5 Drawing Sheets

(56) References Cited

U.S. PATENT DOCUMENTS

| | | | |
|---|---|---|---|
| 7,021,799 B2 * | 4/2006 | Mizuyoshi | 362/373 |
| 7,165,863 B1 * | 1/2007 | Thomas et al. | 362/219 |
| 7,217,004 B2 * | 5/2007 | Park et al. | 362/240 |
| 7,267,461 B2 * | 9/2007 | Kan et al. | 362/373 |
| 7,303,315 B2 | 12/2007 | Ouderkirk et al. | |
| 7,329,024 B2 * | 2/2008 | Lynch et al. | 362/240 |
| 7,400,029 B2 * | 7/2008 | Shimada et al. | 257/625 |
| 7,588,362 B2 * | 9/2009 | Park et al. | 362/612 |
| 7,713,092 B2 * | 5/2010 | Kim et al. | 439/660 |
| 7,862,195 B2 * | 1/2011 | Stack et al. | 362/125 |
| 7,931,387 B2 * | 4/2011 | Song | 362/249.02 |
| 2004/0080939 A1 | 4/2004 | Braddel et al. | |
| 2004/0170019 A1 | 9/2004 | Tamai | |
| 2005/0237747 A1 * | 10/2005 | Shimizu et al. | 362/294 |
| 2006/0043382 A1 * | 3/2006 | Matsui et al. | 257/79 |
| 2006/0187660 A1 * | 8/2006 | Liu | 362/294 |

FOREIGN PATENT DOCUMENTS

| | | |
|---|---|---|
| JP | 2003-152225 A | 5/2003 |
| JP | 2004-006994 | 1/2004 |
| JP | 2004-039594 | 2/2004 |
| JP | 2004-265977 | 3/2004 |
| JP | 2004-228170 | 8/2004 |
| JP | 2004-6245 | 10/2004 |
| JP | 2005-019985 A | 1/2005 |

OTHER PUBLICATIONS

Japanese Office Action for Patent Appln. No. 10-2007-7025649 dated Jul. 19, 2012.

* cited by examiner

LED UNIT AND LED LIGHTING LAMP USING THE LED UNIT

TECHNICAL FIELD

The present invention relates to an LED lighting lamp to be used as a light source for various illumination devices and an LED unit which forms an individual lighting unit, a plurality of which constitute the LED lighting lamp.

BACKGROUND ART

In recent years, a light emitting diode element (hereinafter referred to as LED element) comprising a semi-conductor element has drawn attention as a light source for various illumination devices. LED elements have advantageous effects such as a lower calorific value and a longer operating life, compared to conventional lighting lamps such as filament lamps. The LED elements have in recent years achieved practical uses in various fields, not only as light sources for displays, but also as lighting lamps for general lighting devices or as a vehicle-mounted headlights and the like. However, each one of the LED elements has a low-light intensity when used in a lighting lamp, and therefore, for achieving a high-light intensity, a large number of LED elements are assembled in one package.

Meanwhile, for an LED lighting lamp requiring a high-intensity of light emission, a drive current of the LED element is needed to increase. Accordingly, power loss in the LED element increases, and because most energy is converted into heat, it rises the temperature of the LED element, and therefore, the emission efficiency and brightness of the LED element are lowered. In addition, the higher the temperature of the LED element, the shorter of the operating life of the LED element. Therefore, how to release heat generated in the LED element efficiently is already suggested as a problem to solve, providing a means of thermal release (for reference, see Patent Document 1).

The LED lighting lamp disclosed in Patent Document 1 has a structure such that a substrate on which a plurality of LED elements are mounted is fixed to each of surfaces of a hexagonal column-shaped holder, the holder being supported by a supporting member having a thermal-release hole. The holder is formed by a material having high thermal conductivity so that heat generated in the LED elements is released from the thermal-release hole through the holder.

However, because the LED lighting lamp as mentioned above has a structure in which the heat generated in the LED elements is released by the holder or supporting member, the thermal-release structure must be changed according to the various forms of the LED lighting lamp, leading to a problem of high cost.

Patent Document 1: Japanese Patent Application Publication No. 2004-296245 (FIG. 1, paragraphs 0014 to 0019)

DISCLOSURE OF THE INVENTION

Problem to be Solved by the Invention

An object of the present invention is to provide an LED unit which is configured to have a thermal-release structure and which is applicable to various forms of LED lighting lamp. In addition, another object of the present invention is to provide an LED lighting lamp which has a simple thermal-release structure and which is configured to achieve a low cost by use of the LED unit with the above-mentioned thermal-release structure.

Means for Solving the Problem

To achieve objects above, an LED unit according to the present invention includes a base having high thermal conductivity, a circuit board which includes a wiring pattern and is provided on the base, at least one LED element which is electrically connected to the wiring pattern and disposed on the base, and a light-transmitting resinous body provided to cover on the base to seal the LED element.

In the LED lighting lamp according to the present invention, the LED unit is disposed on a surface of a supporting member having high thermal conductivity.

The supporting member having high thermal conductivity may form into an elongated shape, a plate-like shape or a polygonal-cylindrical shape.

The base and the supporting member are preferably made of a metallic material having high thermal conductivity such as a copper alloy.

Effect of the Invention

LED units according to the present invention allow accommodation of a thermal-release structure in each LED unit itself, design changes of the thermal-release structure is not necessary for various forms of the LED lighting lamp.

Consequently, LED lighting lamps according to the present invention do not require design changes related to thermal-release structure, and therefore, the structure for thermal release is simple at low cost.

BEST MODE FOR CARRYING OUT THE INVENTION

Figure 1:
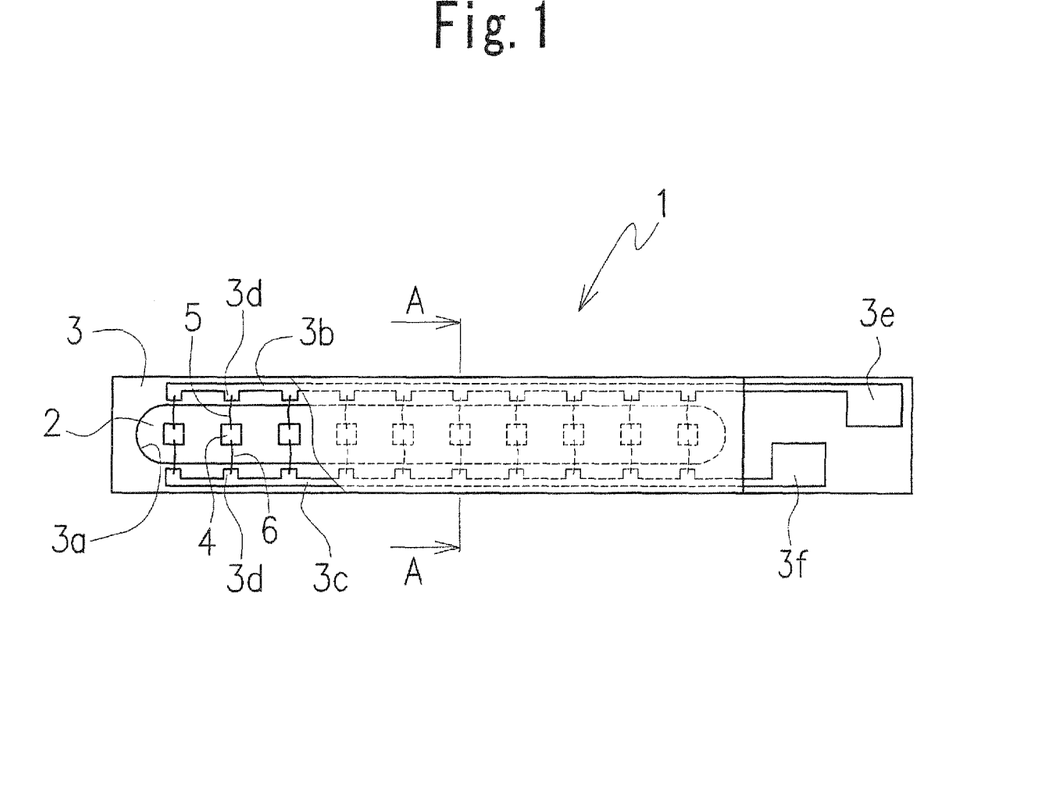
FIG. 1 is a plan view showing one embodiment of an LED unit according to the present invention.
Figure 2:
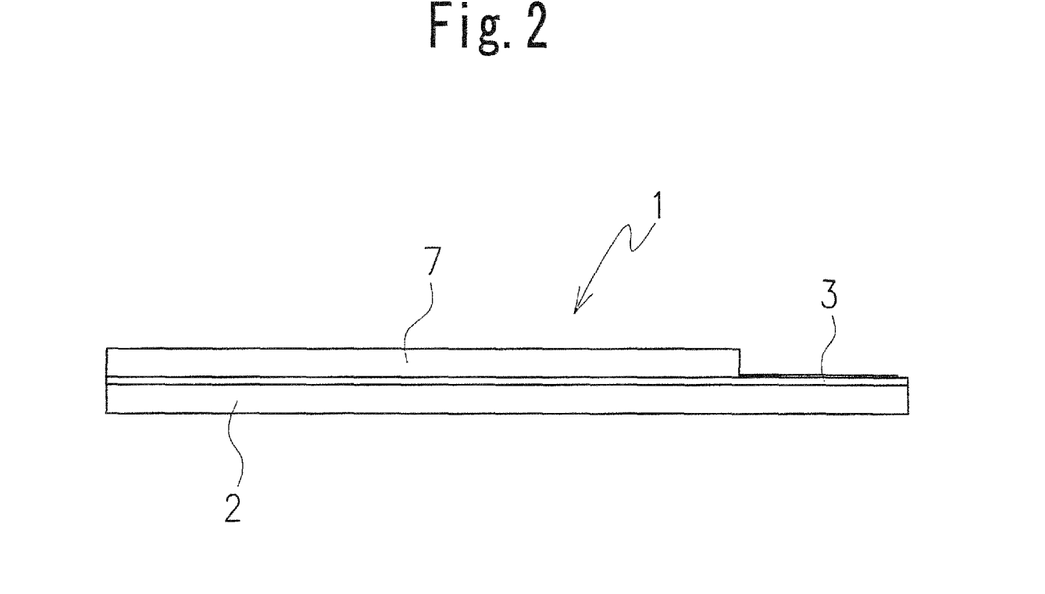
FIG. 2 is a front view showing the one embodiment of the LED unit according to the present invention.
Figure 3:
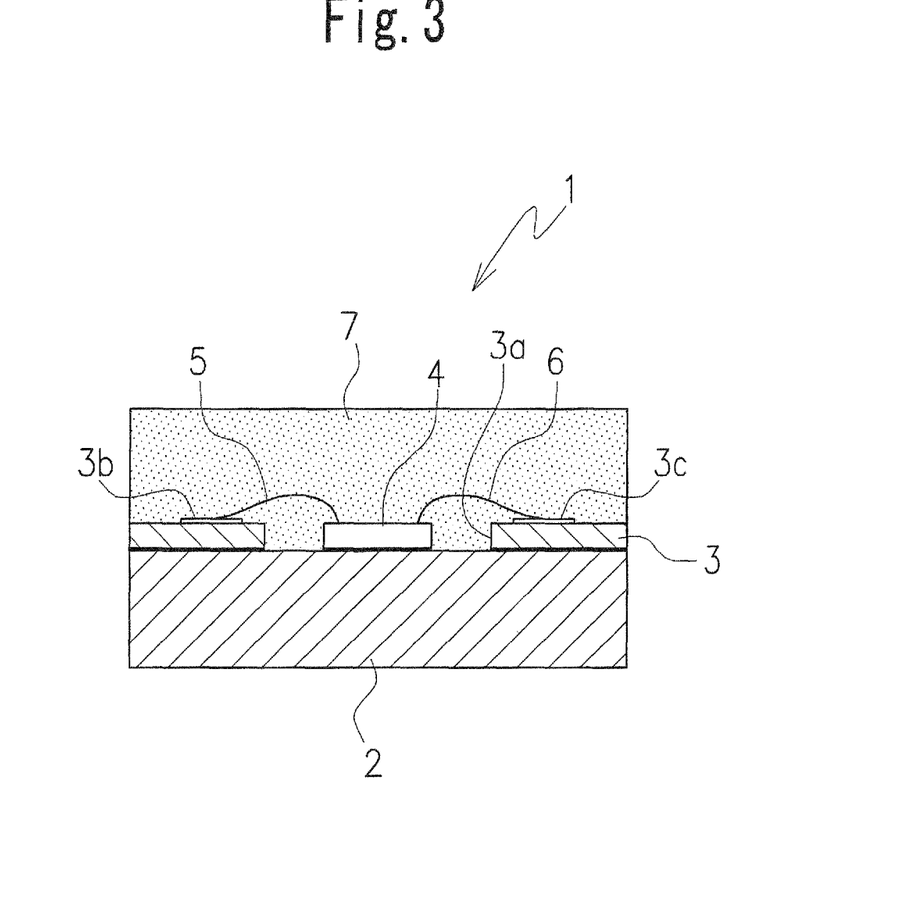
FIG. 3 is a sectional view taken along line A-A in FIG. 1.

Preferred embodiments of the present invention will be described in detail below with reference to the accompanying drawings. FIGS. 1 to 3 illustrate one embodiment of an LED unit according to the present invention. The LED unit in this embodiment includes a generally rectangular solid-shaped base 2 and a circuit board 3 bonded on an upper surface of the base 2. The base 2 is made of, for example, a metallic material such as a copper alloy or the like having high thermal conductivity, while the circuit board 3 is formed by, for example, a flexible board, glass epoxy board or the like. It should be noted that, because the circuit board 3 has the base 2 disposed thereunder, it is possible to reduce a thickness of the circuit board.

An elongated hole 3a which is provided so as to pass through the circuit board 3 along a longitudinal direction of the base 2 is provided in a central portion of the circuit board 3. Also, wiring patterns 3b and 3c extending along both sides of the hole 3a are provided on an upper surface of the circuit board 3, and a plurality (ten in this embodiment) of inner connecting electrodes 3d which are connected to the wiring patterns 3b and 3c respectively are provided at regular intervals. In addition, terminal electrodes 3e and 3f connected to the wiring patterns 3b and 3c are provided on one end portion of the circuit board 3.

A plurality of LED elements 4 provided at regular intervals on the upper surface of the base 2 are exposed within the hole 3a. Ten LED elements 4 are provided at positions corresponding to respective inner connecting electrodes, fixed to the upper surface of the base 2 by silver paste and connected to the inner connecting electrodes 3d by way of thin metallic wires 5 and 6. The LED elements 4, the wiring patterns 3b and 3c, and the thin metallic wires 5 and 6 are sealed by a light-transmitting resinous body 7 which is provided to cover on the base 2 and is made of epoxy resin, silicon resin or the like. It should be noted that the terminal electrodes 3e and 3f provided at the one end of the circuit board 3 are in a state such that they are exposed from the resinous body 7 and are to be connected to external electrode terminals or the like through a socket which is not shown.

Next, an operation of the LED unit 1 with the above-mentioned structure is explained. When a drive voltage is applied to the terminal electrodes 3e and 3f, all ten LED elements 4 are energized to light up via the wiring patterns, and light is emitted, passing through the resinous body 7. Heat is generated in the LED elements 4, but, because lower surfaces of the LED elements 4 are in close contact with the base 2 having high thermal conductivity, the heat generated in the LED elements 4 is efficiently released through the base 2. That is to say, the base 2 constitutes a heat-release structure of the LED unit 1. It should be noted that, to enhance heat-release efficiency of the base 2, an additional heat-release members may be attached to the base 2.

Next, various forms of LED lighting lamp using the LED units with the above-mentioned structure are explained.

Figure 4:
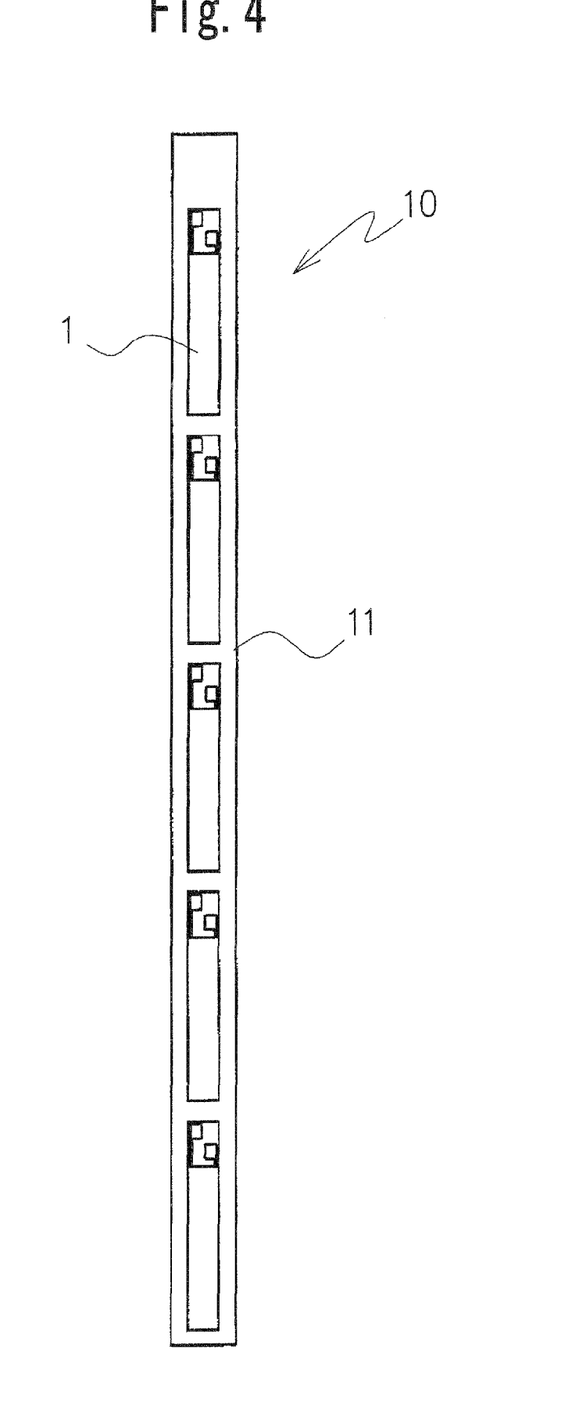
FIG. 4 is a plan view showing a line-shaped LED lighting lamp, which is assembled using the LED units according to the present invention.

One embodiment of a long-thin-shaped LED lighting lamp 10 is shown in FIG. 4. The linear-shaped LED lighting lamp 10 has a structure in which a plurality of LED units 1 each of which has the above-mentioned structure are disposed on an upper surface of an elongated thin plate-shaped supporting member 11 along a longitudinal direction thereof. Any desired number of LED units 1 may be used according to a length of the supporting member 11. In this embodiment, the LED units are disposed in a single line, but may be disposed in two lines or more. It should be noted that the supporting member 11 is preferably made of a metallic material such as a copper alloy or the like having high thermal conductivity to increase the thermal-release effect.

Figure 5:
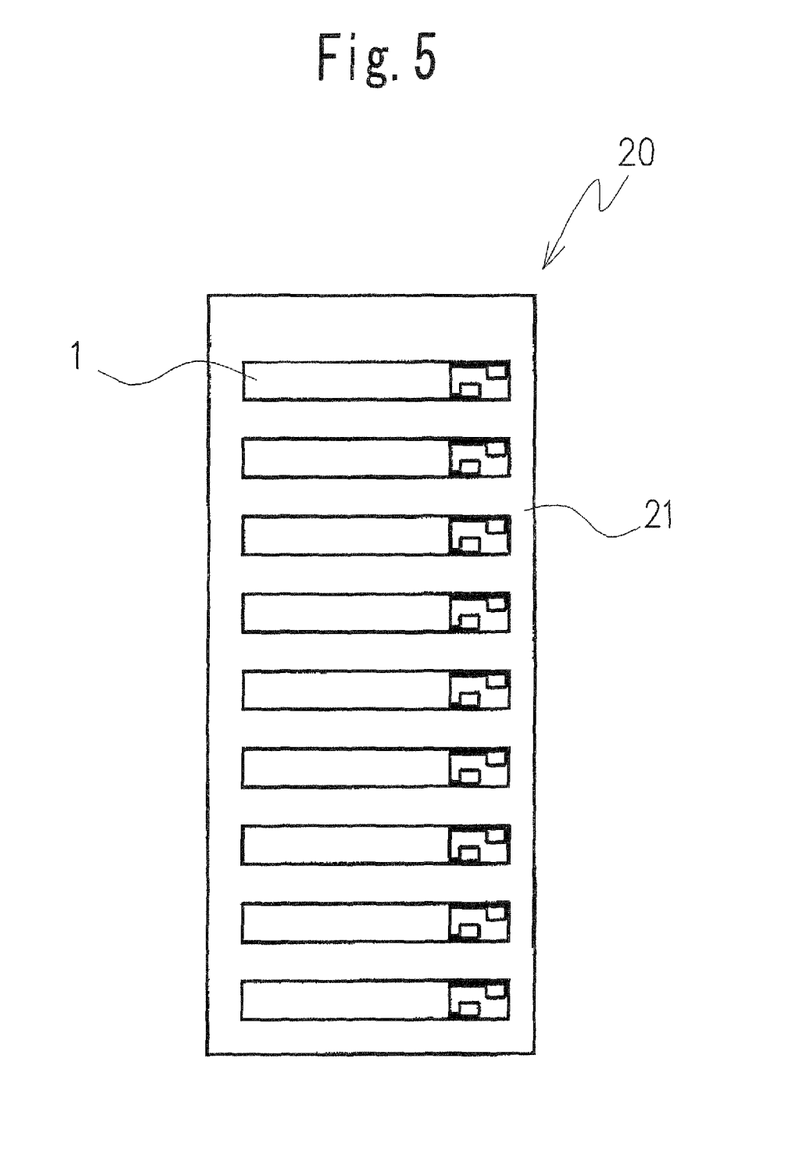
FIG. 5 is a plan view showing a panel-shaped LED lighting lamp which is assembled using the LED units according to the present invention.

FIG. 5 illustrates one embodiment of a panel-shaped LED lighting lamp 20. The panel-shaped LED lighting lamp 20 has a structure in which a plurality of LED units each of which has the above-mentioned structure are arranged side-by-side on an upper surface of a flat-plate-like supporting member 21 having a broader surface area. It should be noted that a direction of arrangement of the LED units 1 is not limited to that shown in FIG. 5, and that the LED units 1 may be arranged one-behind-another or both side-by-side and one-behind-another, accordingly. Also, in the same way as with the linear-shaped LED lighting lamp 10, any desired number of LED units 1 may be used according to the surface area of the supporting member 21, and the supporting member 21 is preferably made of a metallic material having high thermal conductivity such as a copper alloy.

Figure 6:
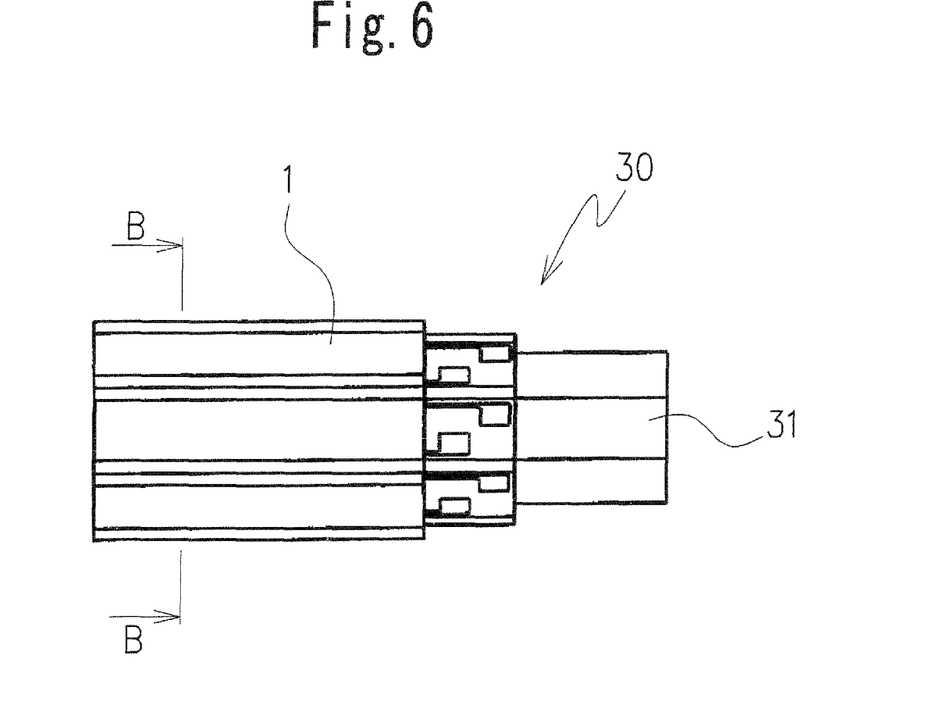
FIG. 6 is a front view showing a bulb-shaped LED lighting lamp which is assembled using the LED unit according to the present invention.
Figure 7:
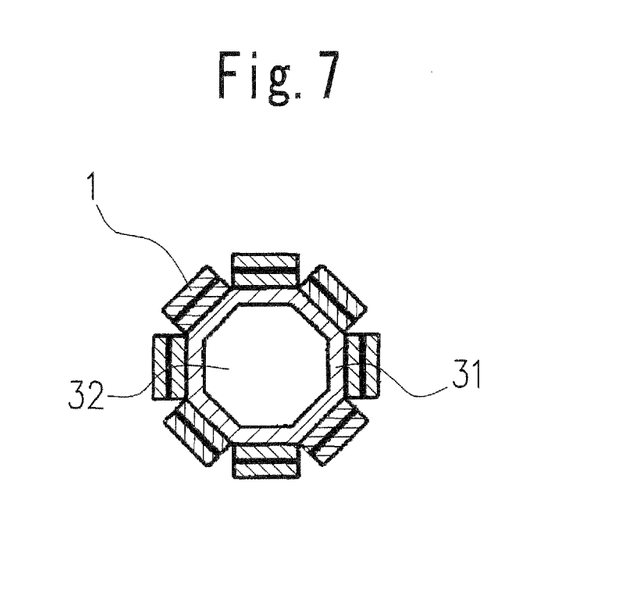
FIG. 7 is a sectional view taken along line B-B in FIG. 6.

FIGS. 6 and 7 illustrates one embodiment of a bulb-shaped LED lighting lamp 30. The bulb-shaped LED lighting lamp 30 has a structure in which a plurality of LED units, each of which has the above-mentioned structure, are arranged on eight surfaces of a regular-octahedral-cylinder-shaped supporting member 31. The supporting member 31 has a polyhedral cylinder shape containing a hollow portion 32 therein and has a structure offering an excellent thermal-release effect, further enhanced by making the supporting member of a copper alloy having high thermal conductivity or the like. It should be noted that the supporting member 31 may be a regular polyhedron other than the regular octahedron and need not contain the hollow portion 32 therein.

As described above, by arranging the above-mentioned LED units 1 each having its own thermal-release structure disposed on the respective supporting members such as 11, 21 and 31, it facilitates manufacture of various forms of LED lighting lamp such as 10, 20 and 30, in a shape of line, panel and bulb or the like. Moreover, because the same shape of LED units 1 can be employed, it is possible to reduce a manufacturing cost as an LED lighting lamp. It should be noted that, a single LED unit can be used, for example, if used for a flash light source of camera, and so on.

It should be noted that various modifications and changes can be made to the above-mentioned preferred embodiments of the LED units and the LED lighting lamp according to the present invention.

INDUSTRIAL APPLICABILITY

The LED unit according to the present invention can be used as an individual lighting unit, a plurality of which constitute various forms of LED lighting lamp.

Also, the LED lighting lamp according to the present invention may be widely employed as an illumination light source in general illumination devices or in vehicle-mounted headlights and the like.

DESCRIPTION OF REFERENCE NUMERALS

1 LED unit
2 base
3 circuit board
3b, 3c wiring patterns
3d inner connecting electrodes
3e, 3f terminal electrodes
4 LED element
5, 6 thin metallic wires
7 resinous body
10, 20, 30 LED lighting lamps
11, 21, 31 supporting members
32 hollow portion

The invention claimed is:
1. A light-emitting-diode unit, comprising:
a base having an elongated shape and high thermal conductivity;
only a single circuit board having an elongated shape and provided on an upper surface of the base,
the circuit board including a single elongated penetrating hole formed at a central portion thereof,
a pair of wiring patterns formed on an upper surface of the circuit board extending along both sides of the single elongated penetrating hole,
and a pair of terminal electrodes including a first terminal electrode and a second terminal electrode that are pro- vided at one end portion of the upper surface of the circuit board and connected respectively to ends of the pair of wiring patterns;

a plurality of light-emitting-diode elements mounted in a line between the pair of wiring patterns on the upper surface of the base exposed in the single elongated penetrating hole of the circuit board and each electrically connected to the pair of wiring patterns by a pair of wires; and a light-transmitting resinous body provided to cover the upper surface of the circuit board and the upper surface of the base exposed in the single elongated penetrating hole of the circuit board and to seal the plurality of light-emitting-diode elements with the pair of terminal electrodes exposed from the light-transmitting resinous body, wherein the first terminal electrode provided at the one end portion of the upper surface of the circuit board is disposed at a position that is more extended in a longitudinal direction of the base than that of the second terminal electrode, and wherein the base has a flat top surface on which both the circuit board and the light emitting diodes are both fixed on a same level on the flat top surface.

2. The light-emitting-diode unit according to claim 1, wherein the base is made of a copper alloy material.

3. A light-emitting-diode lighting lamp, comprising
a supporting member having high thermal conductivity; and
the light-emitting-diode unit as recited in claim 1, which is disposed on a surface of the supporting member.

4. The light-emitting-diode lighting lamp according to claim 3,
wherein the supporting member is formed in an elongated shape, and
wherein a plurality of the light-emitting-diode units are arranged in a line along a longitudinal direction of the supporting member.

5. The light-emitting-diode lighting lamp according to claim 3,
wherein the supporting member is formed in a plate-like shape, and
wherein a plurality of the light-emitting-diode units are arranged in a two-dimensional panel shape on a surface of the supporting member.

6. The light-emitting-diode lighting lamp according to claim 3,
wherein the supporting member is formed in a polygonal cylindrical shape, and
wherein a plurality of the light-emitting-diode units are arranged in a bulb shape on surfaces of the supporting member.

7. The light-emitting-diode unit according to claim 1,
wherein the base comprises an elongated flat plate and the circuit board set on the base has the substantially same planar shape as that of the base.

8. The light-emitting-diode unit according to claim 1,
wherein the pair of wiring patterns further include a plurality of inner connected electrodes; and
wherein the plurality of light-emitting diode elements are electrically connected to the pair of wiring patterns through the plurality of inner connected electrodes by a plurality of metallic wires.

9. The light-emitting-diode unit according to claim 1,
wherein the light-transmitting resinous body further seals the plurality of inner connected electrodes and the plurality of metallic wires.

* * * * *

UNITED STATES PATENT AND TRADEMARK OFFICE
CERTIFICATE OF CORRECTION

PATENT NO.        : 8,596,820 B2
APPLICATION NO.   : 11/911658
DATED             : December 3, 2013
INVENTOR(S)       : Fukasawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1155 days.

Signed and Sealed this
Twenty-second Day of September, 2015

Michelle K. Lee
*Director of the United States Patent and Trademark Office*